(12) United States Patent  
Uezato

(10) Patent No.: US 11,600,541 B2  
(45) Date of Patent: Mar. 7, 2023

(54) SEMICONDUCTOR MODULE

(71) Applicant: FUJI ELECTRIC CO., LTD., Kawasaki (JP)

(72) Inventor: Yoshinori Uezato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 59 days.

(21) Appl. No.: 17/134,742

(22) Filed: Dec. 28, 2020

(65) Prior Publication Data

US 2021/0257268 A1 Aug. 19, 2021

(30) Foreign Application Priority Data

Feb. 14, 2020 (JP) .............................. JP2020-023584

(51) Int. Cl.
*H01L 23/049* (2006.01)
*H01L 23/373* (2006.01)
*H01L 23/00* (2006.01)
*H01L 25/075* (2006.01)

(52) U.S. Cl.
CPC ........ *H01L 23/049* (2013.01); *H01L 23/3735* (2013.01); *H01L 23/562* (2013.01); *H01L 25/0753* (2013.01)

(58) Field of Classification Search
None
See application file for complete search history.

(56) References Cited

U.S. PATENT DOCUMENTS

| 2009/0309239 | A1 | 12/2009 | Nishimura et al. |
| 2012/0306086 | A1 | 12/2012 | Sugimura et al. |
| 2015/0069601 | A1* | 3/2015 | Yamaguchi ........... H01L 23/293 438/126 |
| 2016/0343590 | A1 | 11/2016 | Yoshihara et al. |
| 2019/0157235 | A1* | 5/2019 | Nakata .................... H01L 24/32 |

FOREIGN PATENT DOCUMENTS

| JP | H09-64258 A | 3/1997 |
| JP | 2009-094293 A | 4/2009 |
| JP | 2009-302212 A | 12/2009 |
| JP | 2012-253125 A | 12/2012 |
| JP | 2014-041876 A | 3/2014 |
| JP | 2018-190930 A | 11/2018 |
| JP | 2018195724 A * | 12/2018 |
| WO | 2015/119110 A1 | 8/2015 |

* cited by examiner

*Primary Examiner* — Robert K Carpenter
(74) *Attorney, Agent, or Firm* — Rabin & Berdo, P.C.

(57) ABSTRACT

A semiconductor module, including a ceramic board, a circuit pattern metal plate formed on a principal surface of the ceramic board, an external connection terminal bonded, via a solder, to the circuit pattern metal plate, and a low linear expansion coefficient metal plate located between the circuit pattern metal plate and the external connection terminal. The circuit pattern metal plate has a first edge portion and a second edge portion, which are opposite to each other and are respectively at a first side and a second side of the circuit pattern metal plate. The low linear expansion coefficient metal plate has a linear expansion coefficient lower than a linear expansion coefficient of the circuit pattern metal plate.

15 Claims, 10 Drawing Sheets

| COMPONENT | MATERIAL | LINEAR EXPANSION COEFFICIENT [ppm/°C] | YOUNG'S MODULUS [GPa] |
|---|---|---|---|
| EXTERNAL CONNECTION TERMINAL | Cu | 16.5 | 110 |
| SOLDER | Sn-Ag BASED | 22.3 | 49 |
| CIRCUIT PATTERN METAL PLATE RADIATION PLATE | Cu | 16.5 | 110 |
| CERAMIC BOARD | $Al_2O_3$ | 6.6 | 330 |
| CERAMIC BOARD | AlN | 4.6 | 304 |
| CERAMIC BOARD | $Si_3N_4$ | 3.4 | 290 |
| SEMICONDUCTOR ELEMENT | Si CHIP | 3.0 | 113 |
| LOW LINEAR EXPANSION COEFFICIENT METAL PLATE | Mo | 4.9 | 323 |

FIG. 7

SEMICONDUCTOR MODULE

CROSS-REFERENCE TO RELATED APPLICATION

This application is based upon and claims the benefit of priority of the prior Japanese Patent Application No. 2020-023584, filed on Feb. 14, 2020, the entire contents of which are incorporated herein by reference.

BACKGROUND OF THE INVENTION

1. Field of the Invention

The embodiments discussed herein relate to a semiconductor module having external connection terminals (lead frame) electrically connected to a power semiconductor element.

2. Background of the Related Art

Semiconductor modules are used in power converters such as motor drive inverter units. A semiconductor module includes an insulating substrate having a ceramic board over whose both principal planes a circuit pattern metal plate and a radiation plate, respectively, are formed, a power semiconductor element and external connection terminals mounted over the circuit pattern metal plate, a base plate bonded to the radiation plate, and a case. An insulated gate bipolar transistor (IGBT) and a free wheeling diode (FWD) or a metal-oxide-semiconductor field-effect transistor (MOSFET) is used as the power semiconductor element.

The power semiconductor element and the external connection terminals are bonded to the circuit pattern metal plate mainly by soldering with productivity taken into consideration. When the external connection terminals are bonded to the circuit pattern metal plate, a sufficient amount of solder is supplied between each external connection terminal and the circuit pattern metal plate in order to prevent an electrical connection between each external connection terminal and the circuit pattern metal plate from being broken.

With this semiconductor module a heat cycle is performed because heat is generated by the power semiconductor element at the time of the operation of the semiconductor module. Accordingly, a thermal stress caused by the expansion and contraction of the solder and the circuit pattern metal plate is applied to a portion of the ceramic board over which each external connection terminal is mounted. The linear expansion coefficient of the solder is higher than that of the circuit pattern metal plate and the volume of the solder is great. This increases a thermal stress applied to the ceramic board. Furthermore, when a thermal deformation of the base plate occurs due to heat generated by the power semiconductor element, the case also deforms. As a result, a compressive stress and a tensile stress are applied from the case to each external connection terminal fixed to the case. Accordingly, a stress concentrates on a peripheral edge portion of the circuit pattern metal plate over which each external connection terminal is mounted. As a result, a crack appears in a portion of the ceramic board where a stress concentrates and the risk of a dielectric breakdown increases.

Formerly the use of a material having a low linear expansion coefficient was proposed as a means to relax a stress caused by heat generated by a semiconductor element (see, for example, Japanese Laid-open Patent Publication No. 2012-253125 or Japanese Laid-open Patent Publication No. 2014-41876). With the technique disclosed in Japanese Laid-open Patent Publication No. 2012-253125, for example, a laminated structure of a circuit pattern metal plate, a copper plate, and a metal plate made of a material having a linear expansion coefficient lower than that of copper of which the copper plate is made is formed. By doing so, damage to a semiconductor device caused by a stress applied to a bonding portion of a semiconductor element and the circuit pattern metal plate is prevented. Furthermore, with the technique disclosed in Japanese Laid-open Patent Publication No. 2014-41876, for example, a member which has the shape of a frame and whose thermal expansion is low is located between the outer periphery of a semiconductor element and a circuit pattern to reduce a stress caused by a difference in thermal expansion and applied to the semiconductor element.

However, the technique disclosed in, for example, Japanese Laid-open Patent Publication No. 2012-253125 or the technique disclosed in, for example, Japanese Laid-open Patent Publication No. 2014-41876 avoids damage to a semiconductor element to which a stress caused by the difference in linear expansion coefficient between the semiconductor element and a circuit pattern metal plate is applied. The technique disclosed in, for example, Japanese Laid-open Patent Publication No. 2012-253125 or the technique disclosed in, for example, Japanese Laid-open Patent Publication No. 2014-41876 does not avoid the appearance of a crack in a ceramic board caused by a stress applied to an external connection terminal.

SUMMARY OF THE INVENTION

According to an aspect, there is provided a semiconductor module including a ceramic board; a circuit pattern metal plate formed on a principal surface of the ceramic board, the circuit pattern metal plate having a first edge portion and a second edge portion, which are opposite to each other and are respectively at a first side and a second side of the circuit pattern metal plate; an external connection terminal bonded, via a solder, to the first or second side of the circuit pattern metal plate; and a low linear expansion coefficient metal plate located between the circuit pattern metal plate and the external connection terminal, the low linear expansion coefficient metal plate having a linear expansion coefficient lower than a linear expansion coefficient of the circuit pattern metal plate.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 7 illustrates an example of the physical properties of each component;

DETAILED DESCRIPTION OF THE INVENTION

Figure 1:
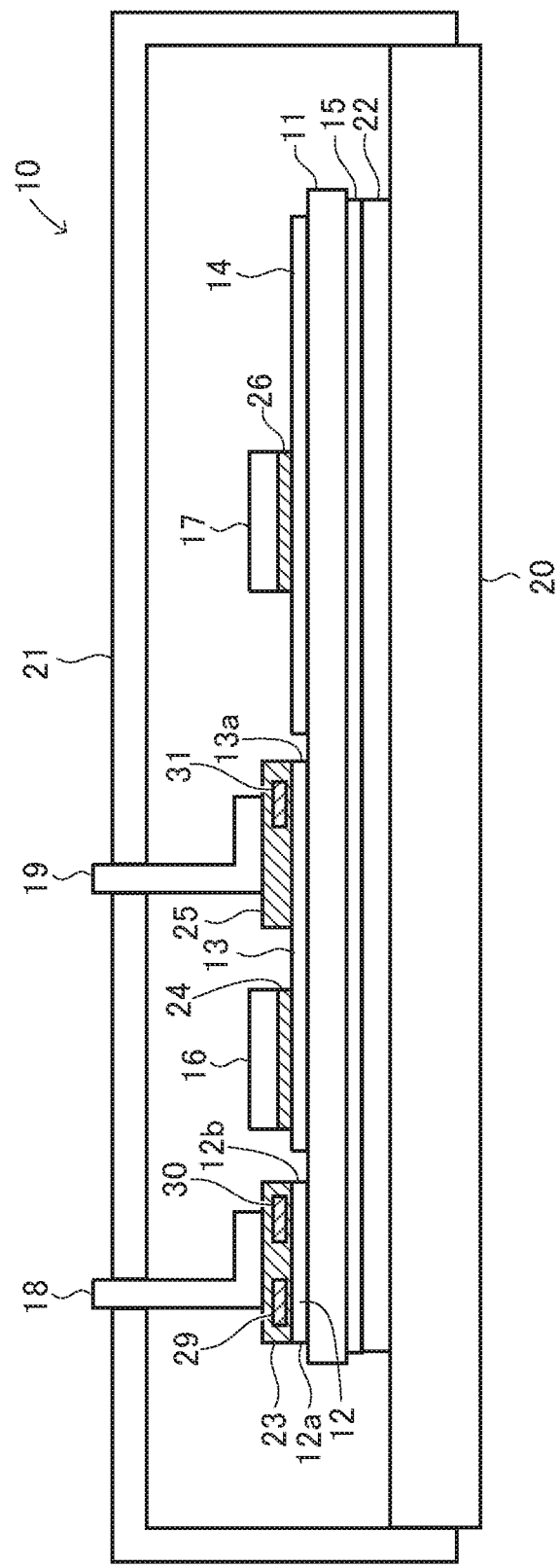
FIG. 1 is a sectional view of a semiconductor module according to a first embodiment.

Embodiments will now be described in detail by reference to the accompanying drawings. In the drawings, components marked with the same numerals are the same. Furthermore, more than one embodiment may partially be combined and implemented as long as there is no contradiction.

First Embodiment

Figure 2:
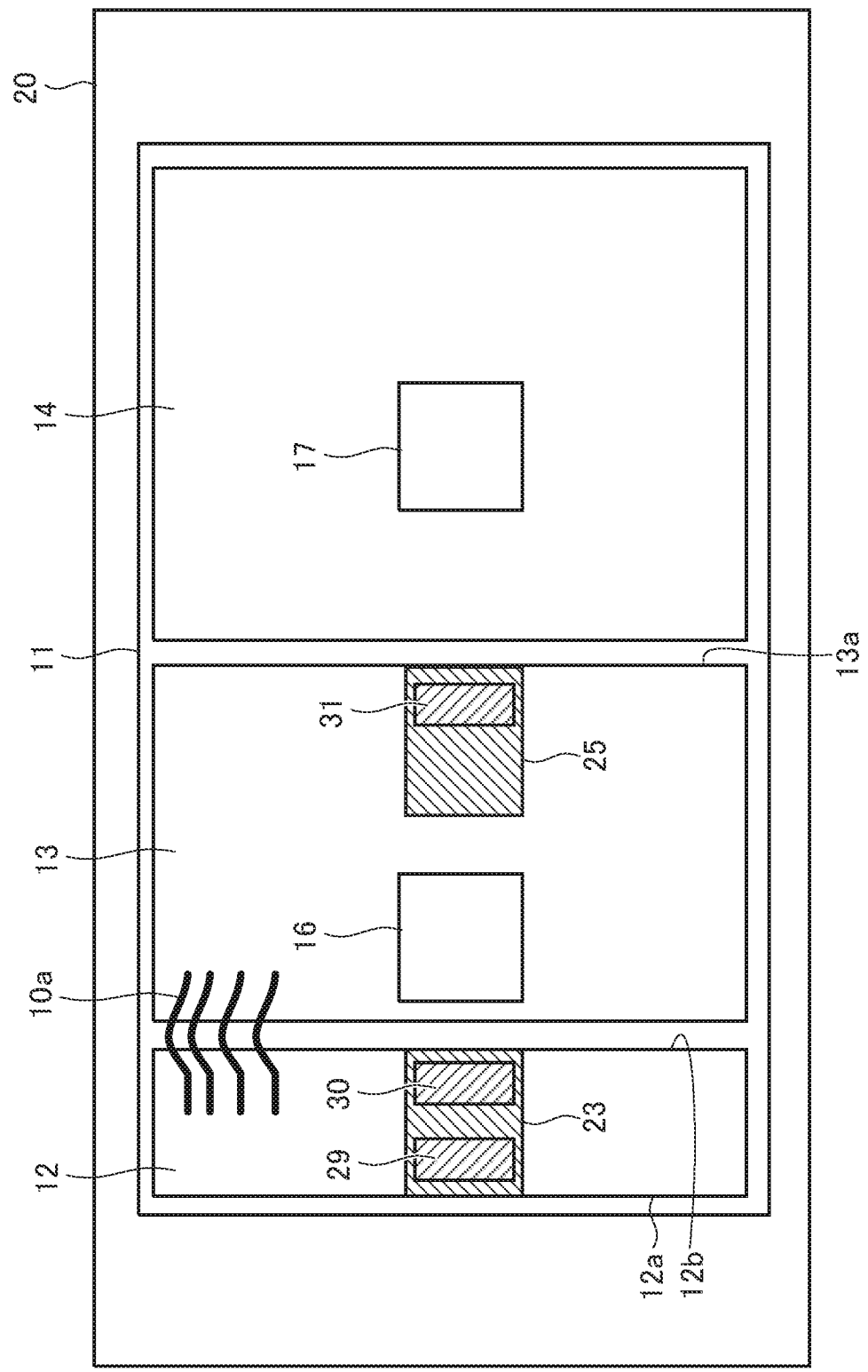
FIG. 2 is a plan view illustrative of the inside of the semiconductor module according to the first embodiment.
Figure 3:
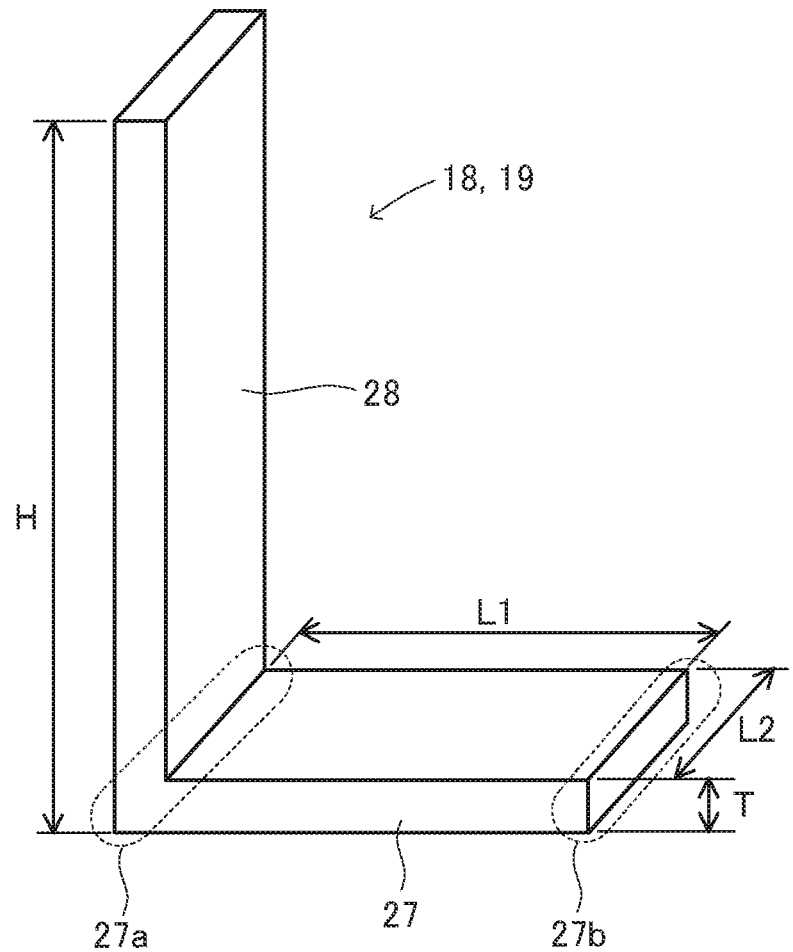
FIG. 3 is a perspective view of an example of an external connection terminal.
Figure 4A:
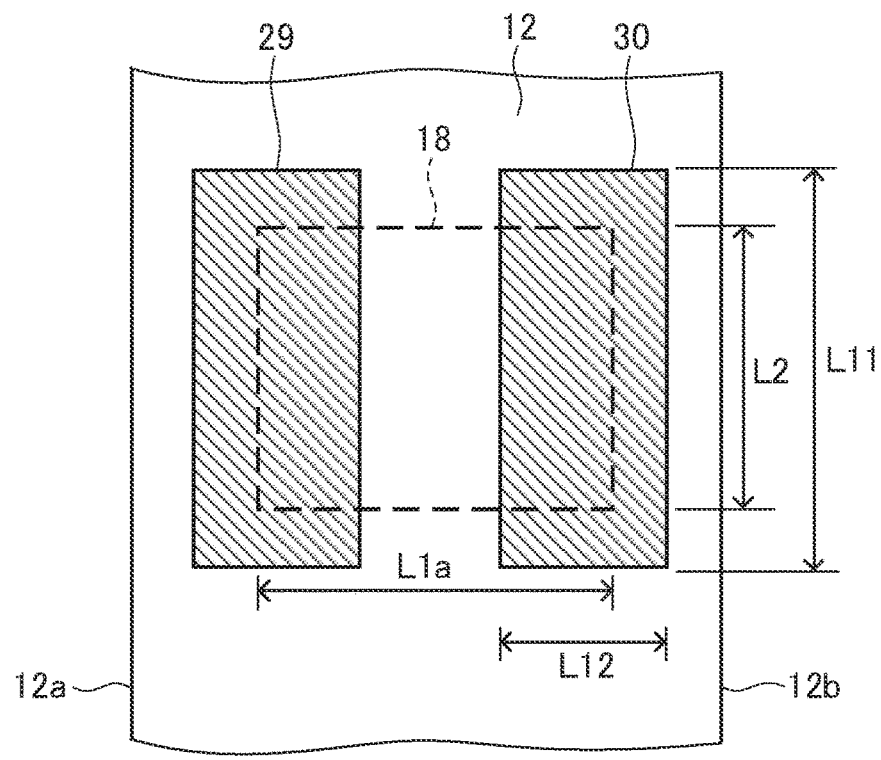
FIGS. 4A and 4B are views for describing the dimensions of a low linear expansion coefficient metal plate, FIG. 4A illustrating the size of the low linear expansion coefficient metal plate with respect to the size of the external connection terminal and FIG. 4B illustrating the thickness of the low linear expansion coefficient metal plate with respect to the thickness of a solder.
Figure 4B:
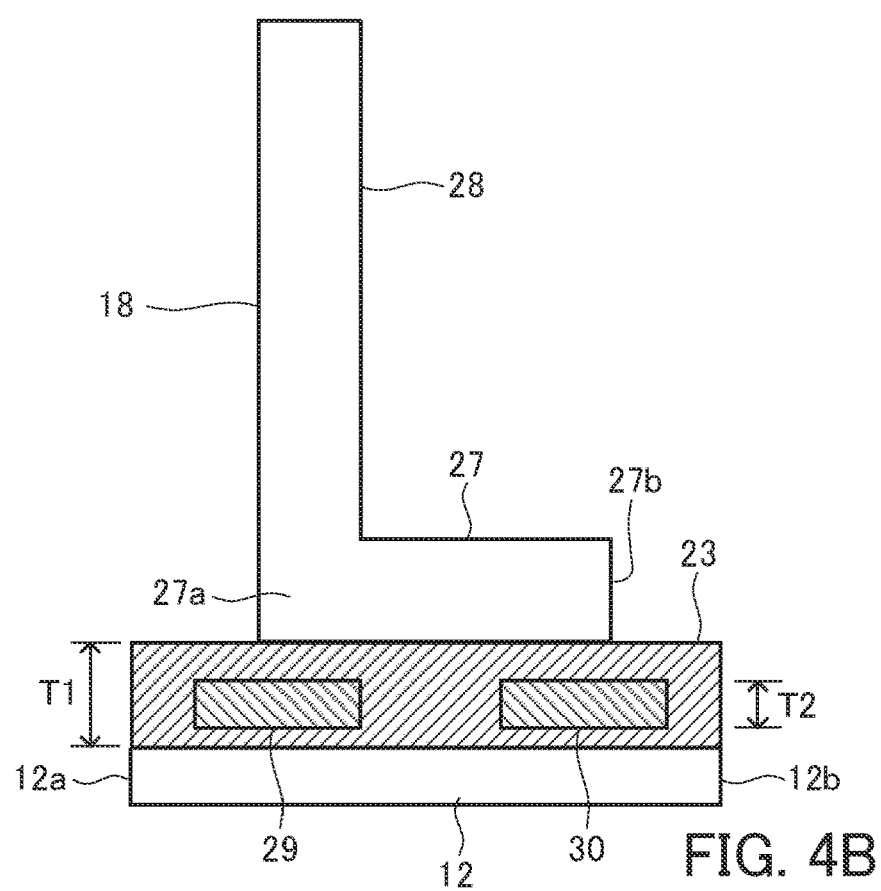
Figure 5A:
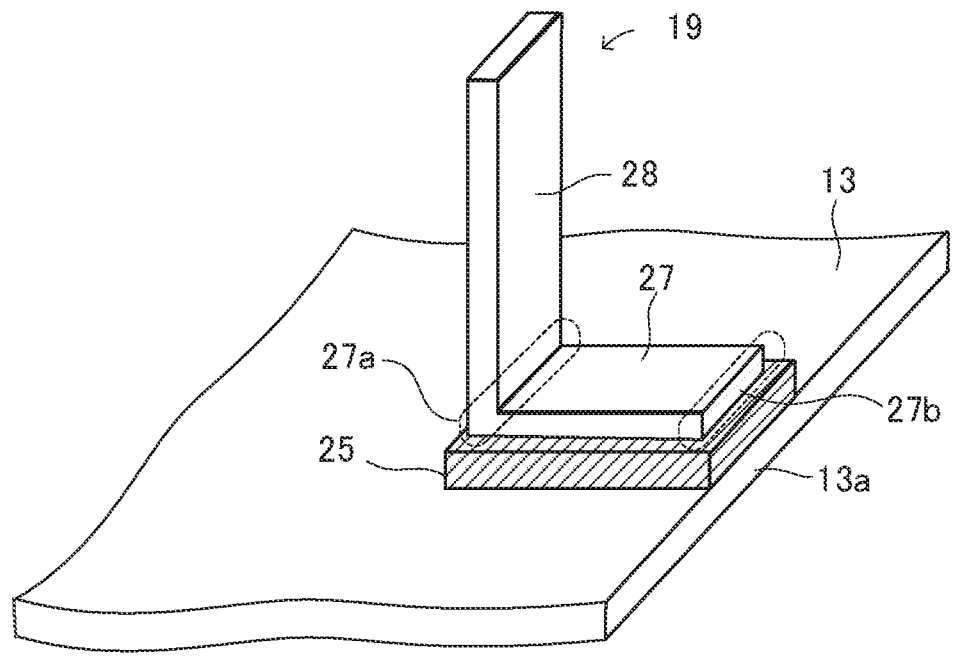
FIGS. 5A and 5B illustrate the disposition of the external connection terminal, FIG. 5A being a perspective view illustrative of the disposition of the external connection terminal, FIG. 5B being a plan view illustrative of the disposition of the external connection terminal.
Figure 5B:
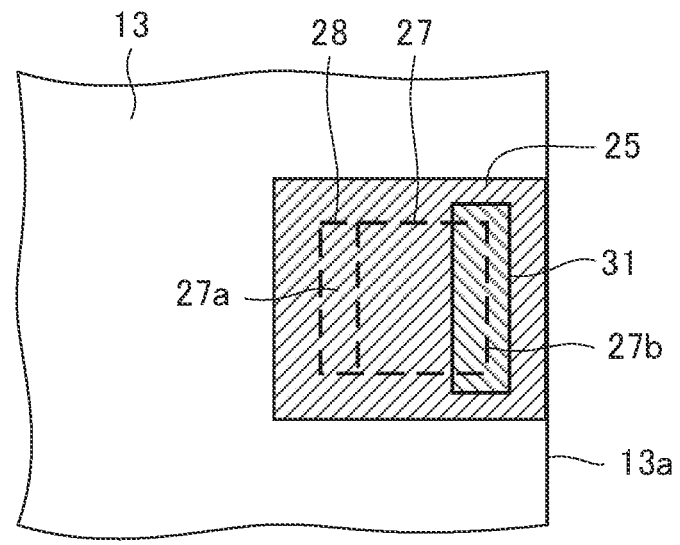
Figure 6A:
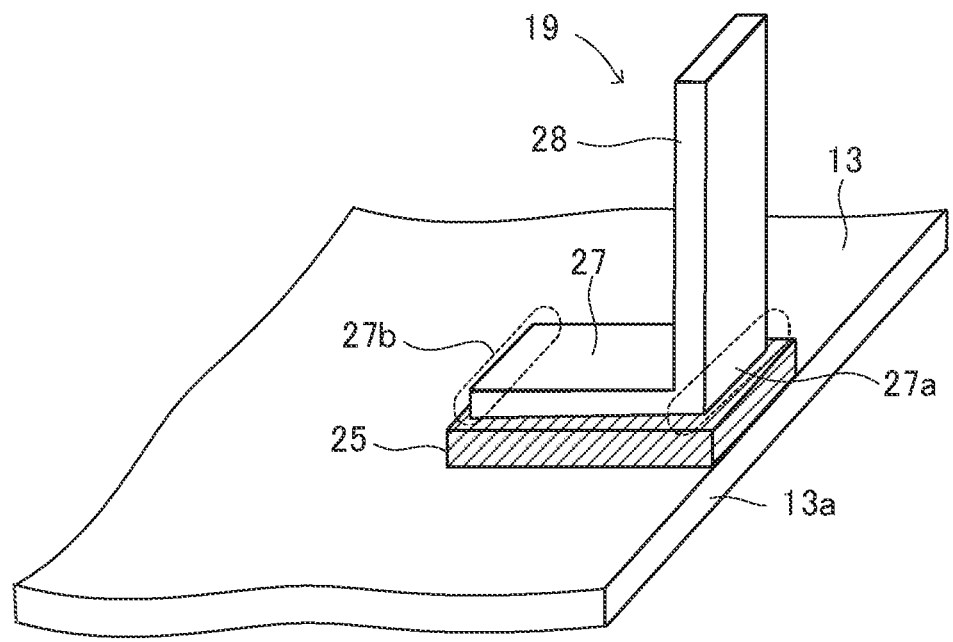
FIGS. 6A and 6B illustrate a modification of the disposition of the external connection terminal, FIG. 6A being a perspective view illustrative of a modification of the disposition of the external connection terminal, FIG. 6B being a plan view illustrative of a modification of the disposition of the external connection terminal.
Figure 6B:
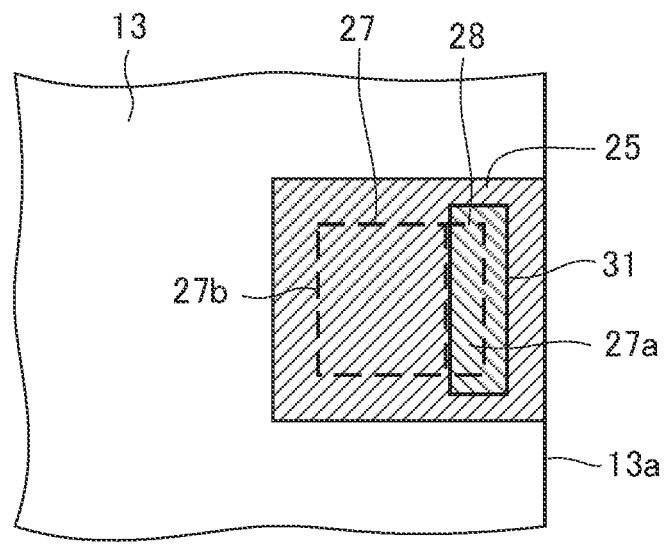

FIG. 1 is a sectional view of a semiconductor module according to a first embodiment. FIG. 2 is a plan view illustrative of the inside of the semiconductor module according to the first embodiment. FIG. 3 is a perspective view of an example of an external connection terminal. FIGS. 4A and 4B are views for describing the dimensions of a low linear expansion coefficient metal plate. FIG. 4A illustrates the size of the low linear expansion coefficient metal plate with respect to the size of the external connection terminal. FIG. 4B illustrates the thickness of the low linear expansion coefficient metal plate with respect to the thickness of a solder. FIGS. 5A and 5B illustrate the disposition of the external connection terminal. FIG. 5A is a perspective view illustrative of the disposition of the external connection terminal. FIG. 5B is a plan view illustrative of the disposition of the external connection terminal. FIGS. 6A and 6B illustrate a modification of the disposition of the external connection terminal. FIG. 6A is a perspective view illustrative of a modification of the disposition of the external connection terminal. FIG. 6B is a plan view illustrative of a modification of the disposition of the external connection terminal. FIG. 7 illustrates an example of the physical properties of each component. The external connection terminal or a case is not illustrated in FIG. 2.

A semiconductor module 10 according to a first embodiment includes a ceramic board 11, circuit pattern metal plates 12, 13, and 14, a radiation plate 15, semiconductor elements 16 and 17, external connection terminals 18 and 19, a base plate 20, and a case 21. The semiconductor module 10 illustrated in FIG. 2 includes bonding wires 10a which connect the circuit pattern metal plates 12 and 13.

The semiconductor elements 16 and 17 are power semiconductor elements. Switching elements, such as IGBTs or MOSFETs, or FWDs are used as the semiconductor elements 16 and 17. Alternatively, reverse-conducting (RC)-IGBTs obtained by integrally forming a switching element and a diode may be used as the semiconductor elements 16 and 17. The semiconductor elements 16 and 17 are made of silicon (Si) or silicon carbide (SiC).

The ceramic board 11, the circuit pattern metal plates 12, 13, and 14, and the radiation plate 15 make up an insulating substrate. The circuit pattern metal plates 12, 13, and 14 are formed over one principal plane of the ceramic board 11. The radiation plate 15 is formed over the whole of the other principal plane of the ceramic board 11 and is bonded to the base plate 20 with a solder 22.

The thickness of the ceramic board 11 is greater than or equal to 0.2 mm and smaller than or equal to 1.2 mm. If the ceramic board 11 is too thin, then a crack may appear in the ceramic board 11 due to bending stress or impact and cause damage to the ceramic board 11. If the ceramic board 11 is too thick, then dissipation of heat generated by a semiconductor element is suppressed and the semiconductor element may be damaged. The thickness of the circuit pattern metal plates 12, 13, and 14 and the radiation plate 15 is greater than or equal to 0.1 mm and smaller than or equal to 2.5 mm. The ceramic board 11 is made of a ceramic having an insulating property. Alumina ($Al_2O_3$), silicon nitride ($Si_3N_4$), aluminum nitride (AlN), or the like is used as a material. The circuit pattern metal plates 12, 13, and 14 and the radiation plate 15 formed over the ceramic board 11 are made of metal, such as copper (Cu), a copper alloy, aluminum (Al), or an aluminum alloy, having high electrical conductivity and high thermal conductivity. The base plate 20 is made of metal, such as copper, a copper alloy, aluminum, or an aluminum alloy, having high thermal conductivity.

The external connection terminal 18 is bonded to the circuit pattern metal plate 12 with a solder 23. As illustrated in FIG. 2, a bonding area of the solder 23 is between two edge portions 12a and 12b opposite each other of the perimeter of the circuit pattern metal plate 12 and is in contact with the edge portions 12a and 12b. That is to say, the bonding area of the solder 23 reaches the edge portions 12a and 12b of the circuit pattern metal plate 12 in the direction of the short sides of the circuit pattern metal plate 12 (in the horizontal direction in FIG. 1 and FIG. 2). The semiconductor element 16 is bonded to the circuit pattern metal plate 13 with a solder 24 and the external connection terminal 19 is bonded to the circuit pattern metal plate 13 with a solder 25. As illustrated in FIG. 2, a bonding area of the solder 25 reaches an edge portion 13a of the perimeter of the circuit pattern metal plate 13. The semiconductor element 17 is bonded to the circuit pattern metal plate 14 with a solder 26.

The base of the solders 23 through 26 is a Pb-free solder. The solders 24 and 26 with which the semiconductor elements 16 and 17 are bonded to the circuit pattern metal plates 13 and 14 respectively are made of a material for which a void is hardly generated and which has high temperature resistance. For example, an alloy-based solder containing tin and antimony (Sn—Sb) as the main ingredients is used. The solders 23 and 25 with which the external connection terminals 18 and 19 are bonded to the circuit pattern metal plates 12 and 13 respectively are made of a material having an elastic modulus lower than that of the solders 24 and 26. For example, an alloy-based solder containing tin and silver (Sn—Ag) as the main ingredients is used. Furthermore, the solders 23 through 26 may contain an additive such as copper, bismuth, indium, nickel, germanium, cobalt, or silicon.

As illustrated in FIG. 3, the external connection terminals 18 and 19 are bent members having the shape of the letter "L". The external connection terminal 18 includes a bonded portion 27 bonded to the circuit pattern metal plate 12 with the solder 23 and a conductive portion 28 electrically connected to the outside. The external connection terminal 19 includes a bonded portion 27 bonded to the circuit pattern metal plate 13 with the solder 25 and a conductive portion 28 electrically connected to the outside. The conductive portions 28 extend from the bonded portions 27 in a direction opposite to or away from solder bonding surfaces of the bonded portions 27. The conductive portions 28 preferably extend from the bonded portions 27 perpendicularly to the solder bonding surfaces of the bonded portions 27. The bonded portions 27 are connected to the conductive portions 28 by bent portions 27a and the sides opposite to the bent portions 27a form end portions 27b of the external connection terminals 18 and 19.

The dimensions of the external connection terminals 18 and 19 are as follows. The length L1 of the bonded portions 27 extending from the conductive portions 28 is 1 to 5 mm. The length L2 of the sides of the bonded portions 27 opposite to the bent portions 27a is 1 to 6 mm. The thickness T of the bonded portions 27 is 0.5 to 1.5 mm. The height H of the conductive portions 28 is 4 to 35 mm. The length L1 and the length L2 are greater than or equal to the thickness T. Furthermore, the thickness T of the bonded portions 27 is smaller than or equal to the thickness of the conductive portions 28. With the external connection terminals 18 and 19 in this embodiment, the length L1 of the bonded portions 27 is 3.0 mm, the length L2 is 1.1 mm, the thickness T is 1.0 mm, and the height H of the conductive portions 28 is 32 mm. A material for the external connection terminals 18 and 19 is copper or a copper alloy.

Low linear expansion coefficient metal plates 29 and 30 having a linear expansion coefficient lower than that of the circuit pattern metal plates 12 and 13 are located between the external connection terminal 18 and the circuit pattern metal plate 12 in a state in which they are buried in the solder 23. The solder 23 reaches the edge portions 12a and 12b of the circuit pattern metal plate 12. The low linear expansion coefficient metal plate 29 is located on the side of the edge portion 12a of the circuit pattern metal plate 12 and the low linear expansion coefficient metal plate 30 is located on the side of the edge portion 12b of the circuit pattern metal plate 12. In this case, the side of the edge portion 12a or 12b of the circuit pattern metal plate 12 is an area extending from the edge portion 12a or 12b which the solder 23 reaches to a straight line just under the external connection terminal 18. Similarly, a low linear expansion coefficient metal plate 31 is also located between the external connection terminal 19 and the circuit pattern metal plate 13 in a state in which it is buried in the solder 25. The solder 25 reaches the edge portion 13a of the circuit pattern metal plate 13. The low linear expansion coefficient metal plate 31 is located on the side of the edge portion 13a of the circuit pattern metal plate 13. In this case, the side of the edge portion 13a of the circuit pattern metal plate 13 is an area extending from the edge portion 13a which the solder 25 reaches to the straight line just under the external connection terminal 19.

A material for the low linear expansion coefficient metal plates 29, 30, and 31 is molybdenum (Mo). The surfaces of the low linear expansion coefficient metal plates 29, 30, and 31 are coated with nickel or tin. As illustrated in FIG. 2, the low linear expansion coefficient metal plates 29, 30, and 31 are rectangular in planar view. However, the number and direction of low linear expansion coefficient metal plates are determined on the basis of places on the circuit pattern metal plates 12 and 13 over which the external connection terminals 18 and 19 are located.

In FIG. 2, the width of the circuit pattern metal plate 12 to which the external connection terminal 18 is bonded is narrow. The area of the solder 23 is between the edge portions 12a and 12b extending in the longitudinal direction of the circuit pattern metal plate 12 and is in contact with the edge portions 12a and 12b. In this case, the bent portion 27a and the end portion 27b of the external connection terminals 18 are apt to apply a stress seen from the external connection terminal 18. A portion of the ceramic board 11 in which a crack is apt to appear is just under the edge portions 12a and 12b of the circuit pattern metal plate 12 seen from the circuit pattern metal plate 12. Accordingly, the low linear expansion coefficient metal plate 29 having the shape of a rectangle in planar view is located on the side of the edge portion 12a of the circuit pattern metal plate 12 so that the long side of the rectangle will extend along the edge portion 12a. The low linear expansion coefficient metal plate 30 having the shape of a rectangle in planar view is also located on the side of the edge portion 12b of the circuit pattern metal plate 12 so that the long side of the rectangle will extend along the edge portion 12b.

On the other hand, the bent portion 27a of the external connection terminal 19 is situated near the center in the short-side direction of the circuit pattern metal plate 13. Only the end portion 27b of the external connection terminal 19 is situated on the side of the edge portion 13a of the circuit pattern metal plate 13. Accordingly, with the circuit pattern metal plate 13 the low linear expansion coefficient metal plate 31 is located only on the side of the edge portion 13a.

With the low linear expansion coefficient metal plates 29 and 30 having the shape of a rectangle in planar view, as illustrated in FIG. 4A, the length L11 of the long sides is greater than the length L2 of the sides of the end portion 27b of the external connection terminal 18. Furthermore, it is assumed that the length Lia of the bonded portion 27 of the external connection terminal 18 perpendicular to the edge portions 12a and 12b of the circuit pattern metal plate 12 is 1. Then the length L12 of the short sides of the low linear expansion coefficient metal plates 29 and 30 is set to 0.1 to 0.3. It is assumed that the thickness T1 of the solder 23 is 1. Then, as illustrated in FIG. 4B, the thickness T2 of the low linear expansion coefficient metal plates 29 and 30 is set to 0.1 to 0.5. The size of the low linear expansion coefficient metal plate 31 is the same as that of the low linear expansion coefficient metal plates 29 and 30.

When the external connection terminals 18 and 19, the circuit pattern metal plates 12 and 13, and the solders 23 and 25 expand thermally, a stress is applied to the ceramic board 11 along the edge portions 12a and 12b of the circuit pattern metal plate 12 and the edge portion 13a of the circuit pattern metal plate 13. Accordingly, if the low linear expansion coefficient metal plate 29, 30, or 31 is not located, then a crack may appear in the ceramic board 11 just under the edge portion 12a or 12b of the circuit pattern metal plate 12 or the edge portion 13a of the circuit pattern metal plate 13. With the semiconductor module 10 according to the first embodiment, the low linear expansion coefficient metal plates 29 and 30 are located between the external connection terminal 18 and the circuit pattern metal plate 12 and the low linear expansion coefficient metal plate 31 is located between the external connection terminal 19 and the circuit pattern metal plate 13. The low linear expansion coefficient metal plates 29, 30, and 31 are formed by the use of molybdenum. A linear expansion coefficient indicates the rate of expansion caused by an increase in temperature. As illustrated in FIG. 7, the linear expansion coefficient of molybdenum is similar to that of the ceramic board 11. That is to say, the linear expansion coefficient of molybdenum is smaller than that of the solders 23 and 25 and is still smaller than that of copper of which the external connection terminals 18 and 19 and the circuit pattern metal plates 12 and 13 are made. As a result, when the circuit pattern metal plates 12 and 13 and the solders 23 and 25 expand thermally, a stress applied to the ceramic board 11 is relaxed by molybdenum. Accordingly, a crack hardly appears in the ceramic board 11 just under the edge portion 12a or 12b of the circuit pattern metal plate 12 or the edge portion 13a of the circuit pattern metal plate 13.

In the first embodiment the external connection terminals 18 and 19 are bonded in a state in which part of the sides of the bonded portions 27 including the bent portions 27a, the edge portions 12a and 12b of the circuit pattern metal plate 12, and the edge portion 13a of the circuit pattern metal plate 13 face the same direction. However, the external connection terminals 18 and 19 may be bonded in a state in which the sides of the bonded portions 27 including the bent portions 27a are perpendicular to the edge portions 12a and 12b of the circuit pattern metal plate 12 and the edge portion 13a of the circuit pattern metal plate 13, that is to say, in a state in which the external connection terminals 18 and 19 are rotated by 90 degrees. Even in this case, the same effect is achieved by locating the low linear expansion coefficient metal plates 29, 30, and 31 in the same way as with the first embodiment. The reason for this is that the positions of the bonded portions 27 to which a stress that causes a crack in the ceramic board 11 is applied are on the sides of the edge portions 12a and 12b of the circuit pattern metal plate 12 and the edge portion 13a of the circuit pattern metal plate 13.

In the first embodiment, part of the sides of the bonded portion 27 including the bent portion 27a of the external connection terminal 18 is parallel to the edge portions 12a and 12b of the circuit pattern metal plate 12 and part of the sides of the bonded portion 27 including the bent portion 27a of the external connection terminal 19 is parallel to the edge portion 13a of the circuit pattern metal plate 13. The low linear expansion coefficient metal plates 29 and 30 are located along and near the edge portions 12a and 12b, respectively, of the circuit pattern metal plate 12. The low linear expansion coefficient metal plate 31 is located along and near the edge portion 13a of the circuit pattern metal plate 13.

To be concrete, as illustrated in FIGS. 4A and 4B, the external connection terminal 18 is located with the bent portion 27a on the side of the edge portion 12a of the circuit pattern metal plate 12 and the end portion 27b on the side of the edge portion 12b of the circuit pattern metal plate 12. At this time the external connection terminal 18 is bonded in a state in which part of the sides of the bent portion 27a and the end portion 27b and the edge portions 12a and 12b of the circuit pattern metal plate 12 face the same direction. The low linear expansion coefficient metal plates 29 and 30 are located near the edge portions 12a and 12b, respectively, of the circuit pattern metal plate 12. As illustrated in FIGS. 5A and 5B, the external connection terminal 19 is located with the end portion 27b on the side of the edge portion 13a of the circuit pattern metal plate 13. At this time the external connection terminal 19 is bonded in a state in which part of the sides of the bent portion 27a and the end portion 27b and the edge portion 13a of the circuit pattern metal plate 13 face the same direction. The low linear expansion coefficient metal plate 31 is located near the edge portion 13a of the circuit pattern metal plate 13.

FIGS. 6A and 6B illustrate a modification of the disposition of the external connection terminal 19. With this modification a direction in which the external connection terminal 19 is located is changed. That is to say, the external connection terminal 19 is located with the bent portion 27a on the side of the edge portion 13a of the circuit pattern metal plate 13. At this time the external connection terminal 19 is bonded in a state in which part of the sides of the bent portion 27a and the end portion 27b and the edge portion 13a of the circuit pattern metal plate 13 face the same direction. A change does not occur in this respect. The low linear expansion coefficient metal plate 31 is located just under the bent portion 27a of the external connection terminal 19. However, the low linear expansion coefficient metal plate 31 is located near the edge portion 13a of the circuit pattern metal plate 13. A change does not occur in this respect. This modification of the disposition of the external connection terminal 19 may be applied to the external connection terminal 18. That is to say, the external connection terminal 18 may be bonded to the circuit pattern metal plate 12 with the bent portion 27a on the side of the edge portion 12b of the circuit pattern metal plate 12 and the end portion 27b on the side of the edge portion 12a of the circuit pattern metal plate 12.

With the above semiconductor module 10, the conductive portions 28 of the external connection terminals 18 and 19 are pulled up when the base plate 20 and the case 21 deform thermally. This produces the force to pull up the bonded portions 27 including the bent portions 27a. Furthermore, when the base plate 20 and the case 21 deform thermally, the conductive portions 28 of the external connection terminals 18 and 19 move parallel to the principal plane of the base plate 20. This produces the force to pull up the bent portions 27a or the end portions 27b of the bonded portions 27. Accordingly, if the low linear expansion coefficient metal plate 29, 30, or 31 is not located, a crack may appear in the ceramic board 11 just under the edge portion 12a or 12b of the circuit pattern metal plate 12 or the edge portion 13a of the circuit pattern metal plate 13. Even in such a case, a stress applied to the ceramic board 11 is relaxed by locating the low linear expansion coefficient metal plates 29 and 30 between the external connection terminal 18 and the circuit pattern metal plate 12 and locating the low linear expansion coefficient metal plate 31 between the external connection terminal 19 and the circuit pattern metal plate 13. As a result, a crack hardly appears in the ceramic board 11 just under the edge portion 12a or 12b of the circuit pattern metal plate 12 or the edge portion 13a of the circuit pattern metal plate 13.

The low linear expansion coefficient metal plates 29, 30, and 31 are made of molybdenum. The Young's modulus of molybdenum is greater than that of the solders 23 and 25 and is still greater than that of copper of which the external connection terminals 18 and 19 and the circuit pattern metal plates 12 and 13 are made. Accordingly, even if a stress is applied via the external connection terminals 18 and 19 to the circuit pattern metal plates 12 and 13 when the base plate 20 and the case 21 deform thermally, a stress applied to the ceramic board 11 is relaxed by the low linear expansion coefficient metal plates 29, 30, and 31. As a result, a crack hardly appears in the ceramic board 11 just under the edge portion 12a or 12b of the circuit pattern metal plate 12 or the edge portion 13a of the circuit pattern metal plate 13.

(First Modification)

Figure 8:
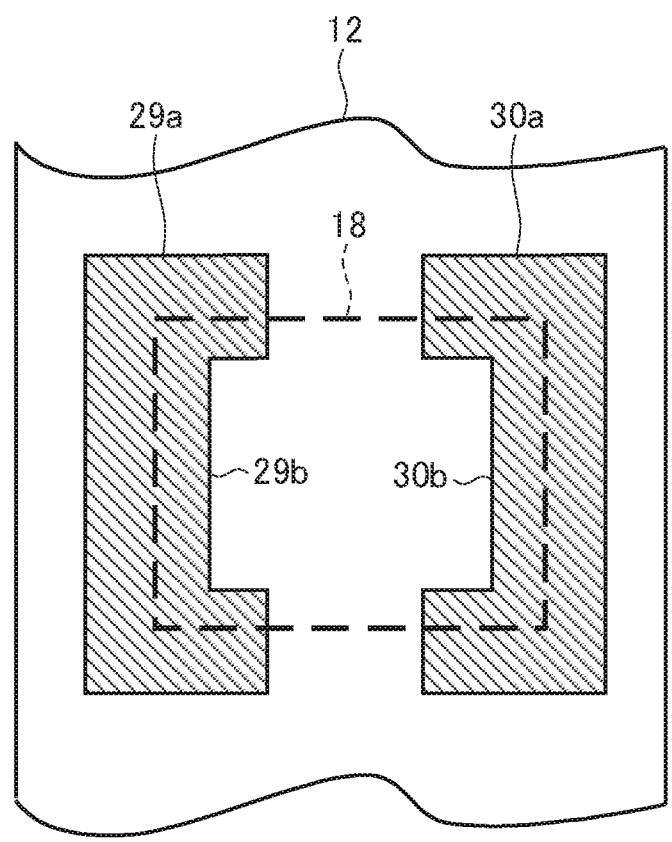
FIG. 8 illustrates a first modification of the low linear expansion coefficient metal plate.

FIG. 8 illustrates a first modification of a low linear expansion coefficient metal plate.

The low linear expansion coefficient metal plates 29 and 30 illustrated in FIG. 2 and FIGS. 4A and 4B have the shape of a rectangle in planar view. However, low linear expansion coefficient metal plates 29a and 30a illustrated in FIG. 8 have notch portions 29b and 30b, respectively, in the middle of sides opposite each other. As a result, the cross-sectional area of the solder 23 between the circuit pattern metal plate 12 and the external connection terminal 18 through which a current flows becomes larger and an electric resistance value becomes smaller. This improves current-carrying capacity.

Locating the two low linear expansion coefficient metal plates 29a and 30a under the external connection terminal 18 is effective. Like the case where the low linear expansion coefficient metal plate 31 is located just under the external connection terminal 19, however, a low linear expansion coefficient metal plate the shape of which is the same as that of the low linear expansion coefficient metal plate 30a may be used. This increases the cross-sectional area of a current-carrying portion and is therefore effective.

(Second Modification)

Figure 9:
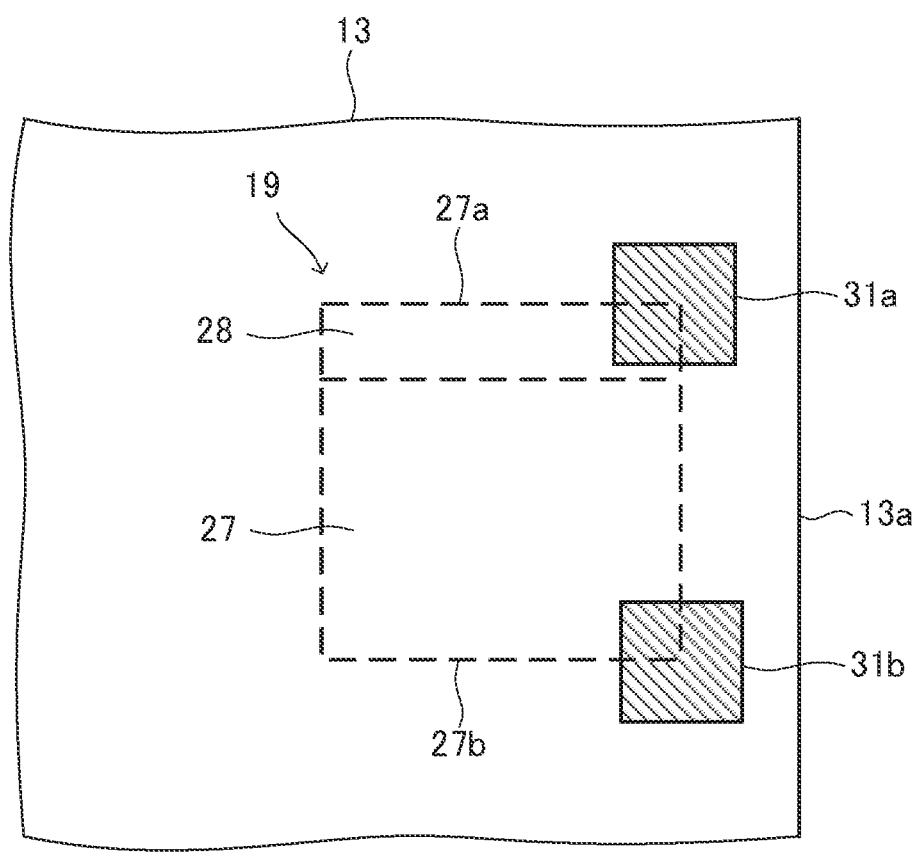
FIG. 9 illustrates a second modification of the low linear expansion coefficient metal plate.

FIG. 9 illustrates a second modification of a low linear expansion coefficient metal plate.

Low linear expansion coefficient metal plates 31a and 31b illustrated in FIG. 9 have the shape of a square in planar view and are located just under corner portions of the bonded portion 27 of the external connection terminal 19 near the edge portion 13a of the circuit pattern metal plate 13. This relaxes a stress applied via the circuit pattern metal plate 13 to the ceramic board 11 by the external connection terminal 19, while lowering an electric resistance value between the circuit pattern metal plate 13 and the external connection terminal 19.

Moreover, a semiconductor module illustrated in FIG. 9 includes the external connection terminal 19 bonded to the circuit pattern metal plate 13 in a different position and direction from the external connection terminal 19 in the first embodiment. This external connection terminal 19 is bonded to the circuit pattern metal plate 13 with the solder 25 in a state in which it is moved to the side of the edge portion 13a of the circuit pattern metal plate 13 and in which the external connection terminal 19 in the first embodiment is rotated clockwise by 90 degrees. A stress concentrates just under the bent portion 27a and the end portion 27b of the external connection terminal 19. A stress concentrates just under the edge portion 13a of the circuit pattern metal plate 13. Accordingly, it is effective to relax a stress applied to portions at which an area in which a stress concentrates by the external connection terminal 19 and an area in which a stress concentrates by the circuit pattern metal plate 13 overlap.

With the semiconductor module illustrated in FIG. 9, the low linear expansion coefficient metal plate 31a is located on the side of the edge portion 13a of the circuit pattern metal plate 13 just under an outer corner portion of the bent portion 27a of the external connection terminal 19 and the low linear expansion coefficient metal plate 31b is located on the side of the edge portion 13a of the circuit pattern metal plate 13 just under the end portion 27b of the external connection terminal 19. The low linear expansion coefficient metal plate 31a is located under the position at which the side of the bonded portion 27 of the external connection terminal 19 on the side of the edge portion 13a of the circuit pattern metal plate 13 and the side of the bent portion 27a intersect. This relaxes a stress applied to the ceramic board 11 just under the conductive portion 28. Similarly, the low linear expansion coefficient metal plate 31b is located under the position at which the side of the bonded portion 27 of the external connection terminal 19 on the side of the edge portion 13a of the circuit pattern metal plate 13 and the side of the end portion 27b intersect. This relaxes a stress applied to the ceramic board 11 just under the bonded portion 27.

FIG. 9 illustrates the case where the low linear expansion coefficient metal plates 31a and 31b are applied to the external connection terminal 19. However, the low linear expansion coefficient metal plates 31a and 31b may be applied in the same way to the external connection terminal 18. If the low linear expansion coefficient metal plates 31a and 31b are applied to the external connection terminal 18, then low linear expansion coefficient metal plates which are equal in shape to the low linear expansion coefficient metal plates 31a and 31b are located just under the four corners of the bonded portion 27 of the external connection terminal 18. Furthermore, the shape of the low linear expansion coefficient metal plates 31a and 31b is not limited to a square in planar view. That is to say, the low linear expansion coefficient metal plates 31a and 31b may have a rectangular, oval, or round shape in planar view. Even in this case, the same effect is obtained.

Second Embodiment

Figure 10:
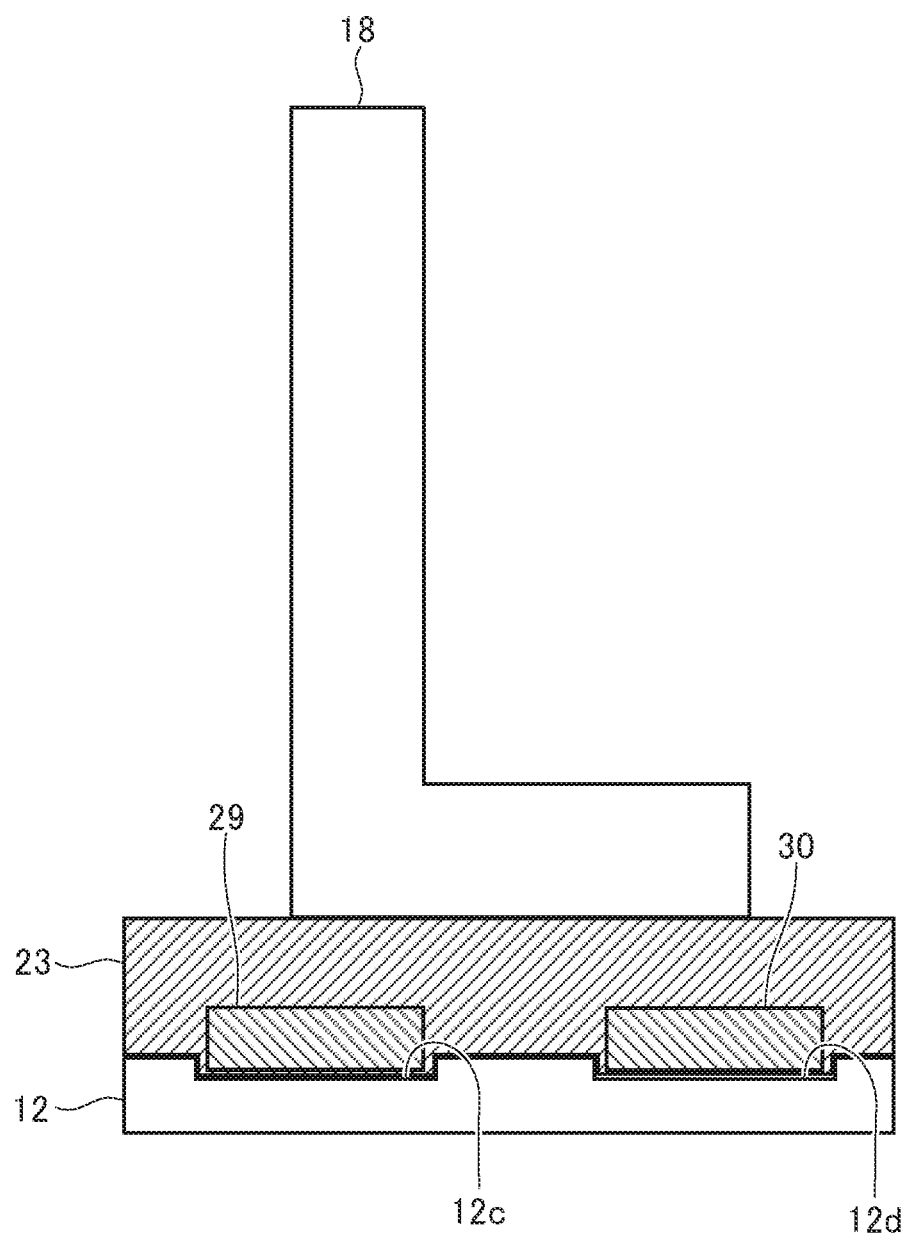
FIG. 10 is a fragmentary sectional view of an external connection terminal mounting portion in a semiconductor module according to a second embodiment.

FIG. 10 is a fragmentary sectional view of an external connection terminal mounting portion in a semiconductor module according to a second embodiment.

With a semiconductor module according to a second embodiment, concave portions 12c and 12d are formed in a surface of a circuit pattern metal plate 12 over which low linear expansion coefficient metal plates 29 and 30, respectively, are to be located. The shape of the concave portions 12c and 12d is greater than the external shape of the low linear expansion coefficient metal plates 29 and 30 respectively and the depth of the concave portions 12c and 12d is smaller than the thickness of a solder 23.

When an external connection terminal 18 is solder-bonded to the circuit pattern metal plate 12, the low linear expansion coefficient metal plates 29 and 30 are fitted into the concave portions 12c and 12d respectively and are positioned by forming level differences in the surface of the circuit pattern metal plate 12. Accordingly, when the solder 23 is melted, the low linear expansion coefficient metal plates 29 and 30 positioned in the concave portions 12c and 12d, respectively, do not move from position.

With the semiconductor module having the above structure, a low linear expansion coefficient metal plate relaxes a stress caused by a difference in thermal expansion and applied from an external connection terminal to a circuit pattern metal plate. As a result, a stress applied to a ceramic board just under an edge portion of the circuit pattern metal plate is also relaxed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module comprising:
a ceramic board;
a circuit pattern metal plate formed on a principal surface of the ceramic board, the circuit pattern metal plate having a first edge portion and a second edge portion, which are opposite to each other and are respectively at a first side and a second side of the circuit pattern metal plate;
an external connection terminal including a bonded portion that has a bonding surface bonded, via a solder, to the first or second side of the circuit pattern metal plate; and
a low linear expansion coefficient metal plate located between the circuit pattern metal plate and the external connection terminal, the low linear expansion coefficient metal plate having a linear expansion coefficient lower than a linear expansion coefficient of the circuit pattern metal plate, wherein
in a plan view of the semiconductor module, a periphery of the bonding surface overlaps the low linear expansion coefficient metal plate.

2. The semiconductor module according to claim 1, wherein
the solder is in contact with both the first and second edge portions of the circuit pattern metal plate, and
the low linear expansion coefficient metal plate includes two low linear expansion coefficient metal plates respectively located on the first side and the second side of the circuit pattern metal plate.

3. The semiconductor module according to claim 2, wherein:
the external connection terminal further includes
a conductive portion extending from the bonded portion in a direction away from the bonding surface, and
a bent portion which connects the bonded portion and the conductive portion, wherein
the bent portion is located on the first side of the circuit pattern metal plate, and
the bonded portion has an end portion that is opposite to the bent portion, and is located on the second side of the circuit pattern metal plate.

4. The semiconductor module according to claim 3, wherein the low linear expansion coefficient metal plate is located under a corner portion of the bonded portion of the external connection terminal disposed along the first or second edge portion of the circuit pattern metal plate.

5. The semiconductor module according to claim 1, wherein the external connection terminal is of a shape of a letter "L", and has
the bonded portion, and
a conductive portion extending from the bonded portion in a direction away from the bonding surface.

6. The semiconductor module according to claim 5, wherein the external connection terminal further includes a bent portion that connects the bonded portion and the conductive portion, the bent portion being disposed along the first edge portion of the circuit pattern metal plate.

7. The semiconductor module according to claim 6, wherein the bent portion of the external connection terminal is located on the first side of the circuit pattern metal plate.

8. The semiconductor module according to claim 6, wherein the bonded portion has an end portion that is opposite to the bent portion, and is located on the second side of the circuit pattern metal plate.

9. The semiconductor module according to claim 5, wherein
each of the first and second edge portions of the circuit pattern metal plate extends in a first direction, and
the low linear expansion coefficient metal plate is of a rectangular shape, long sides of which are each longer than a first length of the bonded portion in the first direction, and short sides of which are each shorter than a second length of the bonded portion in a second direction perpendicular to the first direction.

10. The semiconductor module according to claim 9, wherein
the second length of the bonded portion is 1, and
a length of each of the short sides of the low linear expansion coefficient metal plate is 0.1 to 0.3.

11. The semiconductor module according to claim 9, wherein
a thickness of the solder is 1, and
a thickness of the low linear expansion coefficient metal plate is 0.1 to 0.5.

12. The semiconductor module according to claim 9, wherein
the low linear expansion coefficient metal plate includes a plurality of low linear expansion coefficient metal plates, each of which
is disposed on the first or second side of the circuit pattern metal plate, and
has a notched side and an unnotched side opposite to each other, the notched side having a notch portion in a middle thereof, wherein
the notched side is farther from the first edge portion or the second edge portion of the circuit pattern metal plate than the unnotched side, when said each low linear expansion coefficient metal plate is on the first side or the second side of the circuit pattern metal plate, respectively.

13. The semiconductor module according to claim 1, wherein the circuit pattern metal plate has a concave portion for positioning the low linear expansion coefficient metal plate.

14. The semiconductor module according to claim 1, wherein the low linear expansion coefficient metal plate is a metal containing molybdenum as a main ingredient.

15. The semiconductor module according to claim 14, wherein a surface of the low linear expansion coefficient metal plate is coated with nickel or tin.

* * * * *